(12) United States Patent
Inuzuka

(10) Patent No.: US 6,777,310 B2
(45) Date of Patent: Aug. 17, 2004

(54) METHOD OF FABRICATING SEMICONDUCTOR DEVICES ON A SEMICONDUCTOR WAFER USING A CARRIER PLATE DURING GRINDING AND DICING STEPS

(75) Inventor: Tadashi Inuzuka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/263,682

(22) Filed: Oct. 4, 2002

(65) Prior Publication Data

US 2003/0134490 A1 Jul. 17, 2003

(30) Foreign Application Priority Data

Jan. 11, 2002 (JP) .............................. 2002-4081

(51) Int. Cl.[7] ...................... H01L 21/301; H01L 21/46; H01L 21/78
(52) U.S. Cl. .................. 438/460; 438/113; 438/464
(58) Field of Search ................ 438/455, 456, 438/459, 460, 462–465

(56) References Cited

U.S. PATENT DOCUMENTS

| | | | | |
|---|---|---|---|---|
| 5,641,714 A | * | 6/1997 | Yamanaka | 438/14 |
| 5,888,883 A | * | 3/1999 | Sasaki et al. | 438/460 |
| 6,076,585 A | * | 6/2000 | Klingbeil et al. | 156/584 |
| 6,297,131 B1 | * | 10/2001 | Yamada et al. | 438/464 |
| 6,425,971 B1 | * | 7/2002 | Silverbrook | 156/230 |
| 6,558,975 B2 | * | 5/2003 | Sugino et al. | 438/64 |
| 2002/0037631 A1 | * | 3/2002 | Mimata | 438/460 |
| 2002/0096743 A1 | * | 7/2002 | Spooner et al. | 257/620 |
| 2002/0123210 A1 | * | 9/2002 | Liu | 438/459 |

FOREIGN PATENT DOCUMENTS

| | | |
|---|---|---|
| JP | 09-022933 | 1/1997 |
| JP | 9330940 | 12/1997 |
| JP | 11-307488 | 11/1999 |
| JP | 2002-026039 | 1/2002 |
| WO | WO 01/85600 A1 | 11/2001 |

* cited by examiner

Primary Examiner—John F. Niebling
Assistant Examiner—Angel Roman
(74) Attorney, Agent, or Firm—Rabin & Berdo, PC

(57) ABSTRACT

A method of fabricating a semiconductor device on a semiconductor wafer includes: adhering a carrier plate on an upper surface of the semiconductor wafer via a double-faced protective tape; and thereafter grinding an undersurface of the semiconductor wafer, which includes a circuit pattern formed on the upper surface, to reduce the thickness of the semiconductor wafer.

20 Claims, 6 Drawing Sheets

METHOD OF FABRICATING SEMICONDUCTOR DEVICES ON A SEMICONDUCTOR WAFER USING A CARRIER PLATE DURING GRINDING AND DICING STEPS

BACKGROUND OF THE INVENTION

1. Field of the Invention

The present invention relates to a method of fabricating a semiconductor device on a semiconductor wafer.

2. Description of the Related Art

A conventional method of fabricating a semiconductor device on a semiconductor wafer generally includes the steps of forming a circuit pattern on the wafer, grinding the wafer, removing a ground layer, storing the wafer, mounting the wafer, dividing (i.e., dicing), die-bonding, fixing, and wire-bonding.

Specifically, a protective tape is first adhered onto a surface of the semiconductor wafer on which the circuit pattern is formed (the circuit pattern surface). The protective tape is then cut to the shape of the semiconductor wafer. The protective tape mechanically and chemically protects the circuit pattern surface of the semiconductor wafer. The protective tape absorbs steps caused by objects projecting from the circuit pattern surface, such as wiring or bumps, so that the pressure applied onto the surface is made uniform during, for example, grinding. In addition, the protective tape protects the wafer from moisture and chemicals.

To reduce the thickness of the wafer, the undersurface of the wafer, on which no circuit pattern is formed, is ground. Then, the ground layer is removed mechanically (e.g., by polishing) or chemically (e.g., by etching).

Next, the protective tape is removed using, for example, a stripping tape, and the wafer is stored in a container such as a magazine.

The wafer, together with a ring, is then mounted on a dicing tape, with the undersurface (i.e., the ground surface) of the wafer contacting the dicing tape. The dicing tape includes an adhesive layer whose adhesive strength is reduced when exposed to UV radiation. The wafer is then divided into semiconductor chips by dicing.

UV light is irradiated onto the undersurface of the semiconductor chip so that the adhesive strength of the adhesive layer of the dicing tape decreases, which causes the dicing tape to expand. Needles penetrate the dicing tape and push out the semiconductor chip at the undersurface thereof. The semiconductor chip, separated from the dicing tape, is held by a collet and then mounted on a lead frame via a die-bonding adhesive made of paste resin.

After the die-bonding is completed, the lead frame is stored in a magazine. The magazine is then heated to cure the resin.

The semiconductor device is completed through, for example, wire-bonding.

The above-described method has drawbacks in terms of handling of the semiconductor wafer. Because the semiconductor wafer is very thin, it easily cracks when it is conveyed through the steps of the fabrication process. This problem is even more serious when consideration is given to the trend to reduce the thickness of semiconductor wafers.

There is also a problem in that, when a conventional wafer is stored in a container or the like, the wafer may sag due to its own weight and sustain damage. FIG. 4 illustrates an example of this occurrence when a conventional wafer 200 is supported from below by ribs 204 in a container 202.

SUMMARY OF THE INVENTION

In view of the aforementioned, an object of the present invention is to provide a method of easily and reliably fabricating a high quality semiconductor device on a semiconductor wafer while preventing damage to the semiconductor wafer.

The first aspect of the present invention is a method of fabricating a semiconductor device on a semiconductor wafer, the method comprising: adhering a carrier plate on an upper surface of the semiconductor wafer via a double-faced protective tape; and thereafter grinding an undersurface of the semiconductor wafer, which includes a circuit pattern formed on the upper surface, to reduce the thickness of the semiconductor wafer.

DETAILED DESCRIPTION OF THE PREFERRED EMBODIMENTS

First Embodiment

Figure 1:
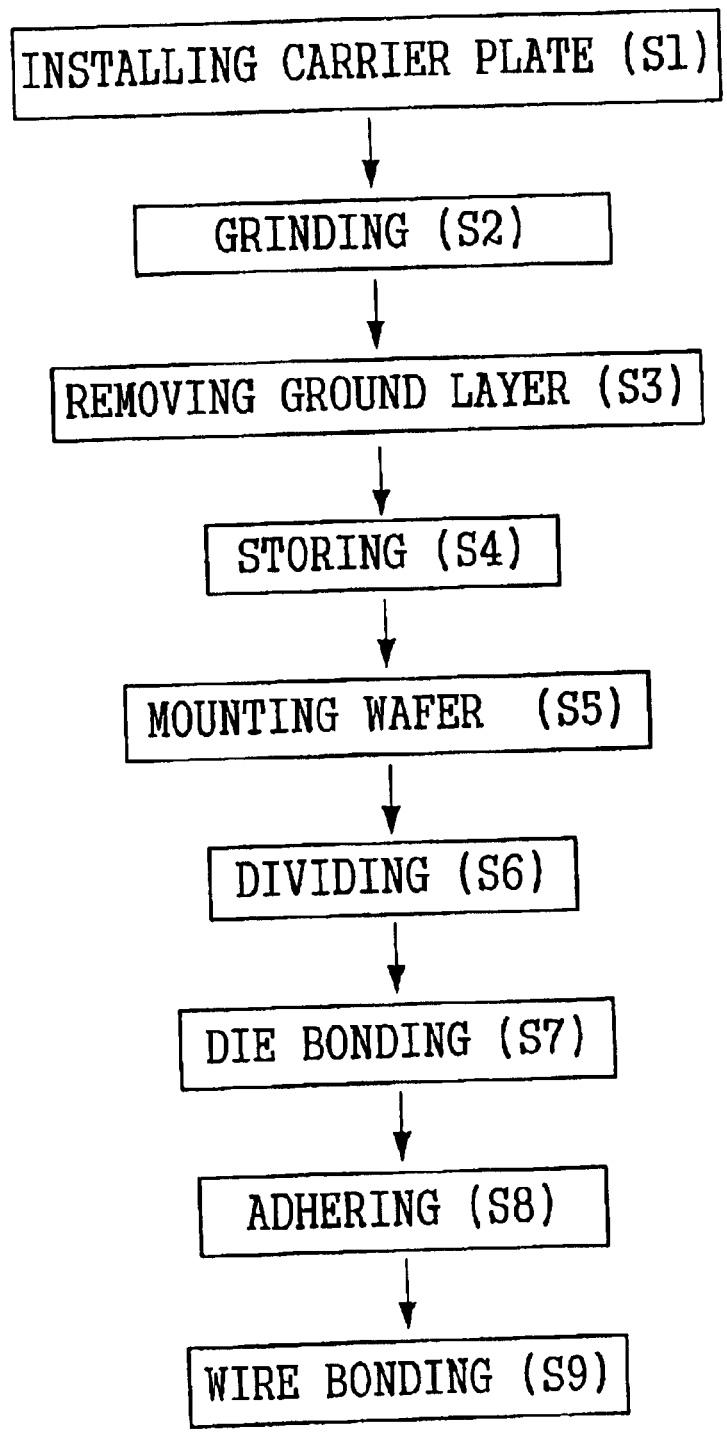
FIG. 1 is a flow chart of a method of fabricating a semiconductor device on a semiconductor wafer relating to a first embodiment of the present invention.

Referring to FIGS. 1 and 2A–2E, a first embodiment of the method of fabricating a semiconductor device on a semiconductor wafer in the present invention will now be described. FIG. 1 is a flow chart, and FIGS. 2A–2E are drawings schematically illustrating steps in the method of the first embodiment.

As shown in FIG. 1, the method of the first embodiment comprises: providing a carrier plate, grinding a wafer, removing a ground layer, storing the wafer, mounting the wafer, dividing the wafer, die-bonding, fixing, and wire-bonding.

Figure 2A:
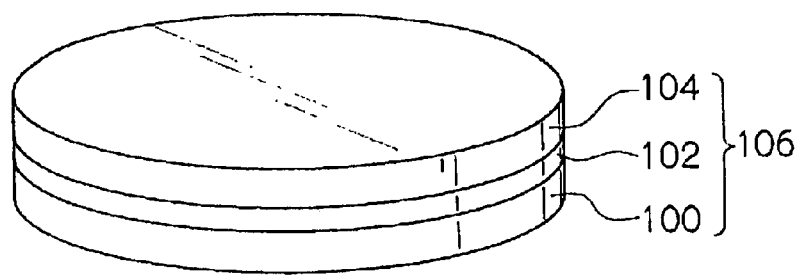
FIGS. 2A–2E schematically illustrate steps in the method of the first embodiment.

As shown in FIG. 2A, a carrier plate 104 is adhered onto a circuit pattern surface of a semiconductor wafer 100 via a double-faced protective tape 102. The protective tape 102 is formed by a substrate and an adhesive applied on both sides of the substrate.

After one of the stripping bases of the double-faced protective tape 102 is removed, the protective tape 102 is adhered on the circuit pattern surface of the wafer 100 using a roller, for example, such that no wrinkles or air bubbles are caused on the circuit pattern surface. The protective tape 102 is then cut to the shape of the wafer 100. After the other of the stripping bases is removed, the protective tape 102 is adhered onto a carrier plate 104 having the same diameter as that of the wafer 100. Hereinafter, the obtained wafer will be referred to as "the (semiconductor) wafer 106 including the carrier plate 104".

Note that the protective tape 102 may be adhered first onto the carrier plate 104 and then onto the wafer 100.

Next, to reduce the thickness of the wafer 100, the undersurface of the wafer 100 having no circuit pattern formed thereon is ground. Then, the ground layer is removed mechanically (e.g., by polishing) or chemically (e.g., by etching).

The steps of grinding and removing the ground layer can be conducted using a conventional method.

Because the carrier plate 104 adheres to the wafer 100, damage to the wafer 100 can be reduced during these steps, and the wafer 100 can therefore be made thinner.

Figure 2B:
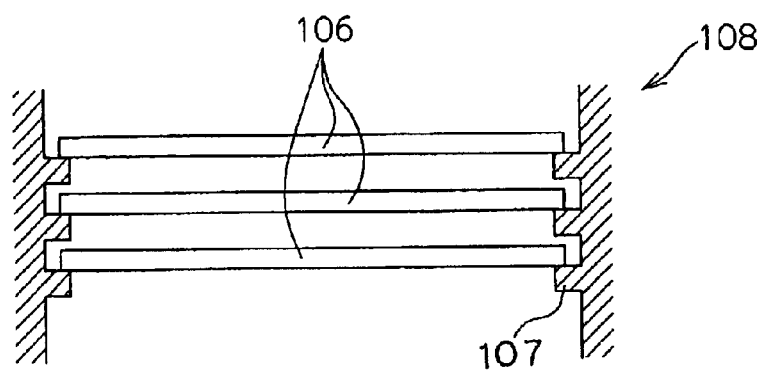

After the ground layer is removed, the wafer 106 including the carrier plate is stored in a container 108 that has ribs 107 as shown in FIG. 2B. The carrier plate 104, which covers the entire surface of the wafer 100, helps prevent the wafer 100 from sagging. Accordingly, the ribs 107 of the container 108 can be pitched normally, thereby increasing the capacity of the container 108.

Figure 2C:
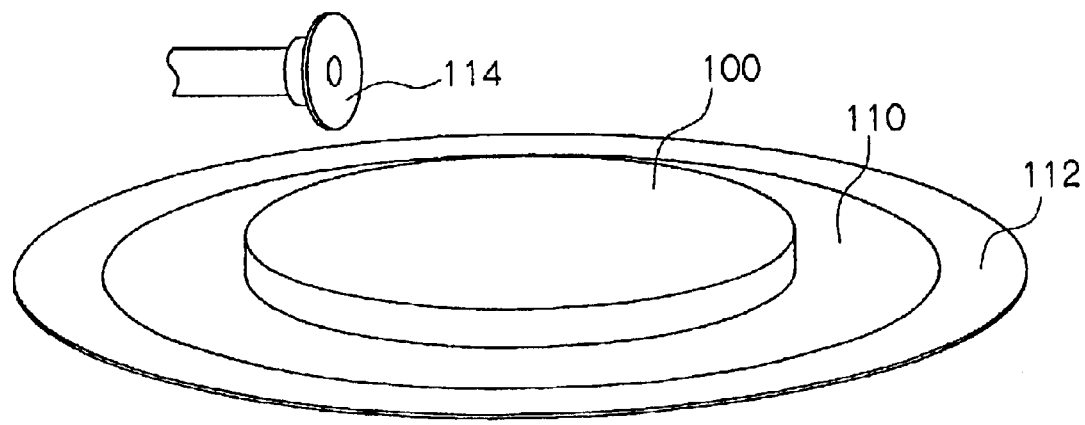

As shown in FIG. 2C, the wafer 106 including the carrier plate and a ring 112 are mounted and fixed on a dicing tape 110, with the undersurface (i.e., the ground surface) of the wafer 100 facing the dicing tape 110. The dicing tape 110 includes an adhesive layer whose adhesive strength is reduced when exposed to UV radiation. The carrier plate 104 and the protective tape 102 are then removed from the wafer 100 using, for example, a stripping tape.

Figure 2D:
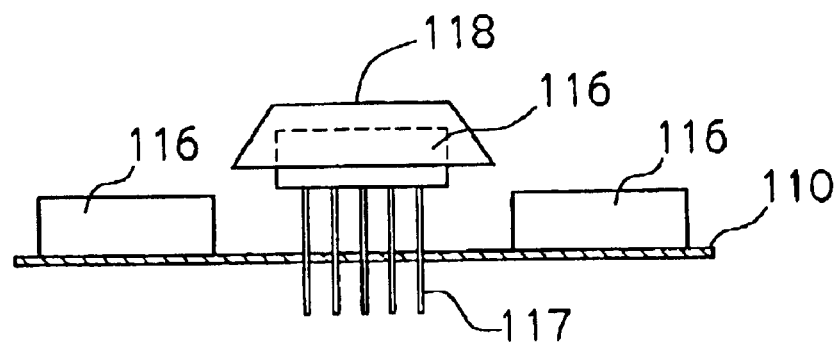

After the carrier plate 104 and the protective tape 102 are removed, the wafer 100 is divided into semiconductor chips 116 by dicing the wafer 100 with a dicing saw 114 as shown in FIG. 2D.

Figure 2E:
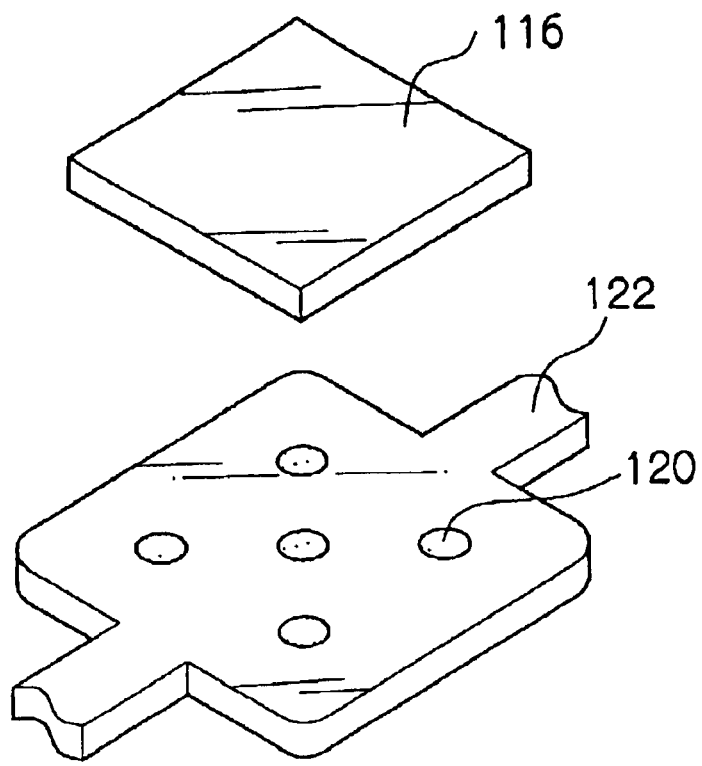

As shown in FIGS. 2D and 2E, UV light is irradiated onto the undersurface of the semiconductor chip 116 so that the adhesive strength of the adhesive layer of the dicing tape 110 is reduced, which causes the dicing tape 110 to expand. A needle member 117 penetrates the dicing tape 110 and pushes out the semiconductor chip 116 from the back thereof. The semiconductor chip 116, separated from the dicing tape 110, is held by a collet 118 and mounted on a die pad 122 of a lead frame via a die-bonding adhesive 120 made of paste resin.

After the die-bonding is completed, the lead frame is stored in a container such as a magazine. The container is then heated to cure the resin.

Then, through wire-bonding and the like, a semiconductor device is completed.

As described above, according to the method of the first embodiment, because the entire surface of the wafer 100 is covered by the carrier plate 104, the wafer 100 can be protected from damage such as cracking during the fabrication process (for example, during conveyance). Accordingly, a high quality semiconductor device can be easily and reliably fabricated by this method.

Further, in this method, a semiconductor device having thickness of less than 50 $\mu$m, which is thin enough to meet future demands for thinner semiconductor wafers, can be obtained.

Second Embodiment

Figure 3A:
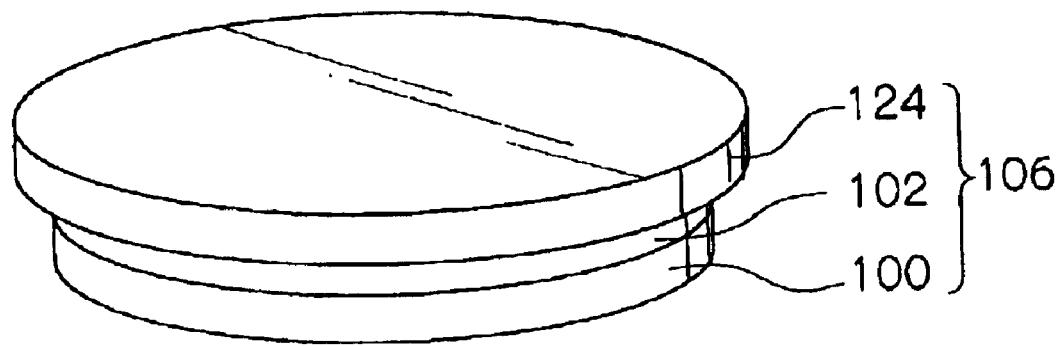
FIG. 3A illustrates a step of providing a carrier plate in a method of fabricating a semiconductor device on a semiconductor wafer relating to a second embodiment of the invention.
Figure 3B:
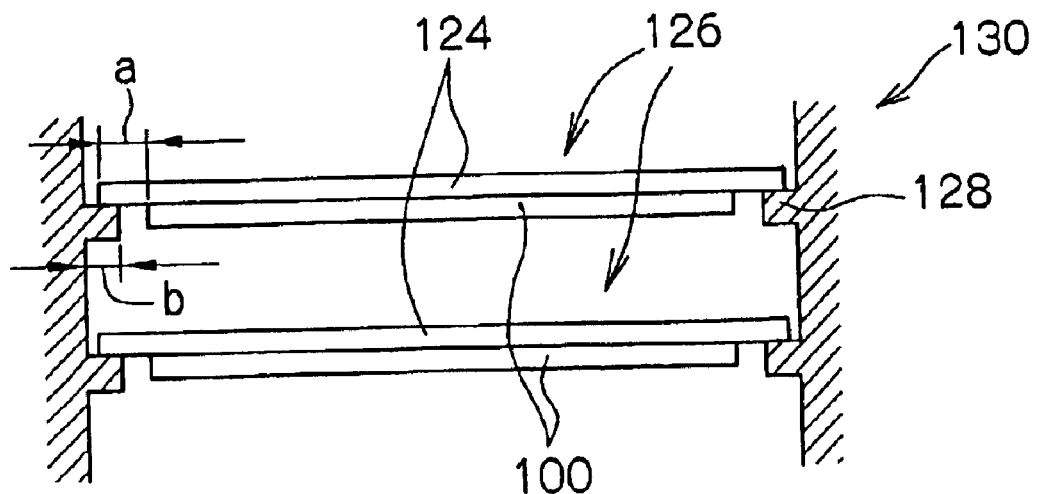
FIG. 3B illustrates a step of storing a wafer in the method of the second embodiment.

Referring to FIGS. 3A and 3B, a second embodiment of the method of the invention will now be described. Because the steps in the method, except for providing the carrier plate and storing the wafer, are the same as the steps in the method of first embodiment, description thereof will be omitted. Components similar to those in the first embodiment are denoted by the similar reference numerals and description thereof will be omitted.

FIG. 3A illustrates a step of providing a carrier plate 124, and FIG. 3B illustrates a step of storing the wafer 100 in the method of the second embodiment.

As shown in FIG. 3A, the semiconductor wafer 100 and the carrier plate 124 are placed concentrically and adhered via the double-faced protective tape 102 in the same manner as in the first embodiment to produce a semiconductor wafer 126 including the carrier plate.

Because the carrier plate 124 is larger than the wafer 100 in diameter, the periphery of the carrier plate 124 extends out from the periphery of the wafer 100. The extending periphery can be held to convey the wafer 100. In this manner, the carrier plate 124 reduces damage to the wafer 100 and the wafer 100 can be easily conveyed during the fabrication process.

As shown in FIG. 3B, the wafer 100 is stored in a container 130 such that the periphery of the carrier plate 124 is supported by ribs 128 of the container 130. It is preferable for the diameter a of the protruding portion of the carrier plate 124 in the radial direction thereof to be larger than the diameter b of the ribs 128 in the extending direction thereof, so that the wafer 100 does not contact the ribs 128 and can be protected from damage.

Although the wafer 100 is supported on the ribs 128 in the present embodiment, it may also be supported by holding members at the periphery of the carrier plate 124.

In the above-described method of storing the wafer 100, because the wafer 100 is not supported at the undersurface (i.e., the ground surface), the undersurface of the wafer 100 is protected from damage during storage in the container 130.

Third Embodiment

A third embodiment of the method of the invention will now be described. Because the steps in the method, except for providing the carrier plate, are the same as the steps in the method of first embodiment, description thereof will be omitted.

In the third embodiment, a double-faced protective tape, at least one surface of which has an adhesive whose adhesive strength is lowered upon heating ("a heat-responsive adhesive"), is used.

In the step of providing a carrier plate, a semiconductor wafer and the carrier plate are adhered to each other via the double-faced protective tape. One surface of the double-faced protective tape has the heat-responsive adhesive, while the other surface has a normal adhesive. Preferably, the surface of the protective tape with the heat-responsive adhesive faces the wafer.

The wafer, after being mounted on a dicing tape, is heated at 180° C. so that the adhesive strength of the adhesive layer of the protective tape is reduced. As a result, the protective tape and the carrier plate can be easily and simultaneously separated from the wafer.

Although the heat-responsive adhesive surface of the protective tape contacts the wafer in the present embodiment, it may also contact the carrier plate. Further, the double-faced protective tape may have the heat-responsive adhesive on both sides thereof.

Fourth Embodiment

Figure 3C:
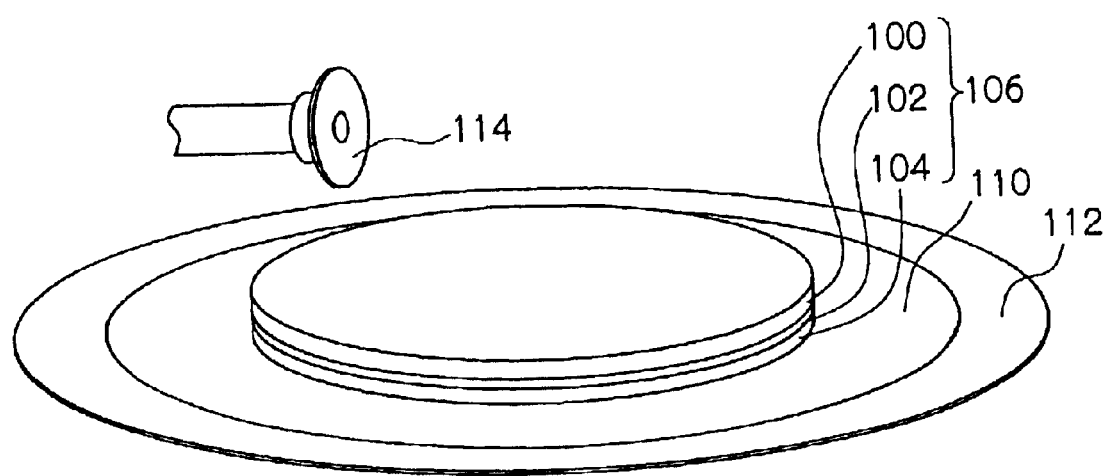
FIG. 3C illustrates a step of mounting and dividing a wafer in a method of fabricating a semiconductor device on a semiconductor wafer relating to a fourth embodiment of the invention.
Figure 3D:
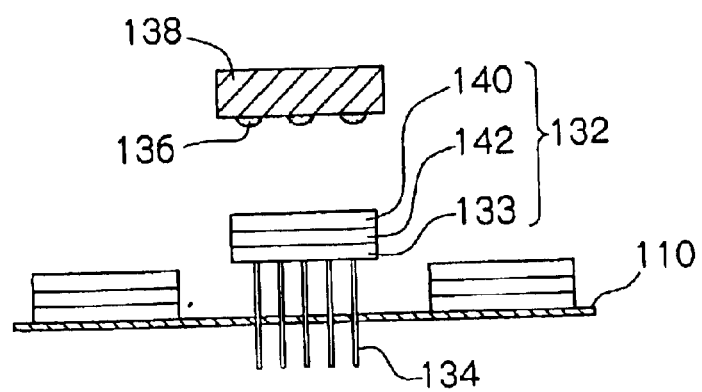
FIG. 3D illustrates a step of die-bonding in the method of the fourth embodiment.
Figure 4:
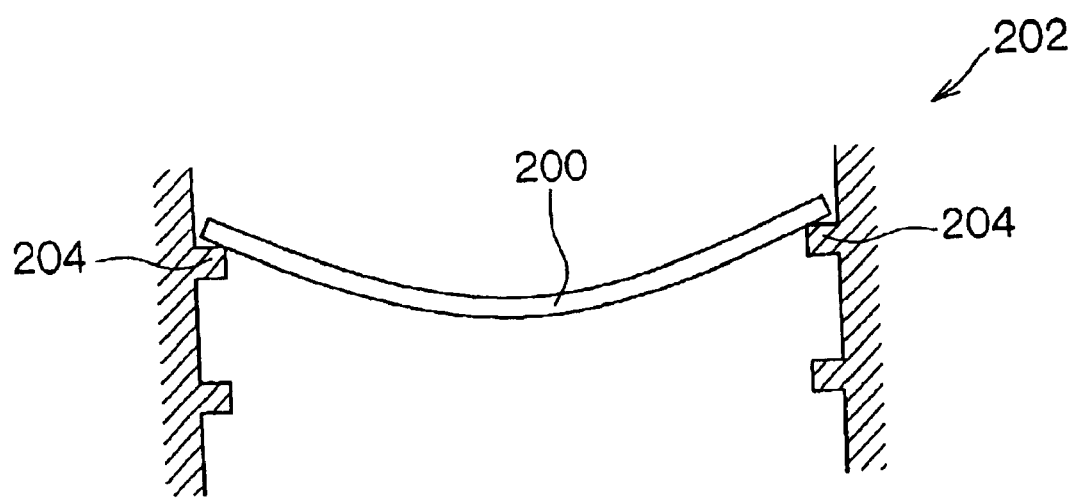
FIG. 4 illustrates a conventional semiconductor wafer stored in a container.

Referring to FIGS. 3C and 3D, a fourth embodiment of the method of the invention will now be described. In the fourth embodiment, the steps of providing the carrier plate, grinding the wafer, removing the ground layer, and storing the wafer are the same as those in the method of first embodiment. Other steps will be described below.

FIG. 3C illustrates a step of mounting and dividing a wafer, and FIG. 3D illustrates a step of die-bonding, in the method of the fourth embodiment. Components having the structures similar to those in the first embodiment are denoted by the similar reference numerals and description thereof will be omitted.

As shown in FIG. 3C, a wafer 106 including the carrier plate is mounted on a dicing tape 110, together with a ring 112 such that the carrier plate 104 and the dicing tape 110 face each other. The dicing tape 110 includes an adhesive layer whose adhesive strength is reduced decreases when exposed to UV radiation. The wafer 106 is then adhered onto the dicing tape 110 via the carrier plate 104.

The wafer 100, together with the protective tape 102 and the carrier plate 104, is divided into semiconductor chips 132 including the carrier plate by a dicing technique with a device that detects a scribing line from the back of the wafer 100 (e.g., a dicing device equipped with an IR camera).

As shown in FIG. 3D, the carrier plate 133 side of the semiconductor chip 132 is exposed to UV radiation so that the adhesive strength of the adhesive layer of the dicing tape 110 is reduced. Then, the dicing tape 110 expands to divide the semiconductor chips 132 including the carrier plate from one another. A needle member 134 penetrates the dicing tape 110 and pushes out the semiconductor chip 132 from the carrier plate 133 side. The semiconductor chip 132, separated from the dicing tape 110, is mounted on a die pad 138 of a lead frame at the back thereof via a die-bonding adhesive 136 made of paste resin.

The die-bonding adhesive 136 may alternatively be applied on the undersurface of the semiconductor chip 140 without causing any damage.

In the step of die-bonding described above, because the semiconductor chip 140 is pushed out at the carrier plate 133 side thereof, damage to the semiconductor chip 140 can be reduced as compared with the case in which the semiconductor chip 140 is directly pushed out at the undersurface (i.e., the ground surface) thereof.

The lead frame is stored in a container such as a magazine, and the container is heated to cure the resin. The protective tape 142 and the carrier plate 133 are then removed from the semiconductor chip 140 using an adhesive tape. The protective tape 142 and the carrier plate 133 may also be removed before the semiconductor chip 132 is fixed onto the die pad 138.

When a double-faced protective tape disposed with a heat-responsive adhesive on at least one surface thereof is used, the step of fixing the semiconductor chip 132 onto the die pad 138 and removing the carrier plate can be conducted in the following manner.

That is, the step of die-bonding in which the semiconductor chip 140 is bonded on the lead frame by curing the die-bonding adhesive 136 and the step of removing the carrier plate 133 from the semiconductor chip 140 by reducing the adhesive strength of the adhesive layer of the protecting tape 142 can be conducted at the same time by heating the lead frame.

In the case in which the protective tape 142 is adhered onto the wafer 100 with the heat-responsive adhesive surface thereof contacting the wafer 100, the protective tape 142 and the carrier plate 133 can be removed from the semiconductor chip 140 at the same time.

Because the circuit pattern surface of the semiconductor chip 140 is covered by the protective tape 142, it is protected from being contaminated by volatile substances in the die-bonding adhesive during heating of the lead frame. Such contamination of the surface would otherwise decrease the intensity of bonding of the wiring or the moisture resistance necessary for a packaging.

Carrier Plate

The carrier plate that is adhered onto the semiconductor wafer, prevents curving or warping of the wafer and makes it easy to handle the wafer. Although a disc-shaped carrier plate that covers the entire surface of the wafer is preferably used, wafers of other shapes, such as a doughnut-shaped carrier plate having an opening in the center thereof, may also be used as long as they do not impair the effects of the invention.

The thickness of the carrier plate depends on the diameter of the semiconductor wafer, and is preferably 400 to 1,500 $\mu$m, more preferably 500 to 1,000 $\mu$m, and most preferably 600 to 800 $\mu$m.

Preferred materials for the carrier plate include materials that are resistive to the etchant (e.g., mixture liquid of HF and $HNO_3$) used in the step of removing the ground layer. Specific examples thereof include polyethylene fluoride (e.g., TEFLON®).

Protective Tape

The protective tape mechanically and chemically protects the circuit pattern surface of the semiconductor wafer, and absorbs steps caused by objects projecting from the circuit pattern surface, such as wiring or bumps, so that the undersurface of the wafer can be ground uniformly. The protective tape is formed by a substrate, made of polyester, for example, adhesive, stripping bases, and the like. Adhesive layers are provided on both sides of the substrate.

Conventional double-faced protective tape may be used in the present invention.

Examples of the heat-responsive adhesive may include an adhesive that contains a foaming agent. Examples of the protective tape having the heat-responsive adhesive may include REVALPHA, a product of Nitto Denko Corporation.

What is claimed is:

1. A method of fabricating a semiconductor device on a semiconductor wafer, the method comprising:

adhering a carrier plate on an upper surface of the semiconductor wafer via a double-faced protective tape, the upper surface having a circuit pattern formed thereon;

after said adhering, grinding an undersurface of the semiconductor wafer, while the semiconductor wafer is adhered to the carrier plate, to reduce a thickness of the semiconductor wafer;

after said grinding, mounting the semiconductor wafer, including the carrier plate adhered thereto, on a dicing tape with the carrier plate facing the dicing tape;

dividing the semiconductor wafer into separate semiconductor chips by dicing the semiconductor wafer together with the protective tape and the carrier plate;

pushing out the separate semiconductor chip, by using a pushing member that pushes the separate semiconductor chip in a direction away from the dicing tape, and that pushes from a side of the semiconductor wafer adhered to the carrier plate; and bonding the undersurface of the semiconductor chip to a lead frame using a die-bonding material.

2. The method of claim 1, wherein the carrier plate is larger than the semiconductor wafer in diameter.

3. The method of claim 2, wherein at least one surface of the double-faced protective tape has an adhesive whose adhesive strength is lowered upon heating.

4. The method of claim 1, further comprising, after said grinding, storing the semiconductor wafer in a container such that the carrier plate is supported by holding portions of the container.

5. The method of claim 4, wherein at least one surface of the double-faced protective tape has an adhesive whose adhesive strength is lowered upon heating.

6. The method of claim 1, further comprising:

fixing the semiconductor chip on the lead frame by curing the die-bonding material; and removing the carrier plate from the semiconductor chip.

7. The method of claim 6, wherein at least one surface of the double-faced protective tape has an adhesive whose adhesive strength is lowered upon heating.

8. The method of claim 1, wherein at least one surface of the double-faced protective tape has an adhesive whose adhesive strength is lowered upon heating.

9. The method of claim 8, further comprising the steps of:

removing the carrier plate from the semiconductor chip by heating both for curing the die-bonding material to fix the semiconductor chip on the lead frame, and for making an adhesive strength of the adhesive layer of the protective tape deteriorate.

10. The method of claim 1, wherein said mounting the semiconductor wafer includes adhering the carrier plate in direct contact with the dicing tape.

11. The method of claim 1, wherein said pushing includes directly engaging the pushing member with the carrier plate.

12. The method of claim 1, wherein during said pushing, the carrier plate separates the semiconductor wafer from the pushing member.

13. A method of fabricating a semiconductor device on a semiconductor wafer, the method comprising:

adhering a carrier plate on an upper surface of the semiconductor wafer via a double-faced protective tape, the upper surface having a circuit pattern formed thereon;

after said adhering, grinding an undersurface of the semiconductor wafer, while the semiconductor wafer is adhered to the carrier plate, to reduce a thickness of the semiconductor wafer;

after said grinding, mounting the semiconductor wafer including the carrier plate adhered thereto, on a dicing tape with the carrier plate facing the dicing tape;

dividing the semiconductor wafer into separate semiconductor chips by dicing the semiconductor wafer together with the protective tape and the carrier plate;

pushing out the separate semiconductor chips, by using a pushing member that pushes the separate semiconductor chip in a direction away from the dicing tape, and that pushes from a side of the semiconductor wafer adhered to the carrier plate;

bonding the undersurface of the semiconductor chip to a lead frame using a die-bonding material; and removing the carrier plate from the semiconductor chip by heating to cure the die-bonding material, fix the semiconductor chip on the lead frame, and cause an adhesive strength of the adhesive layer of the protective tape to deteriorate.

14. The method of claim 13, further comprising fixing the semiconductor chip on the lead frame by curing the die-bonding material; and removing the carrier plate from the semiconductor chip.

15. The method of claim 13, wherein the carrier plate is larger than the semiconductor wafer in diameter.

16. The method of claim 13, further comprising, after said grinding, storing the semiconductor wafer in a container such that the carrier plate is supported by holding portions of the container.

17. The method of claim 13, wherein at least one surface of the double-faced protective tape has an adhesive whose adhesive strength is lowered upon heating.

18. The method of claim 13, wherein said mounting the semiconductor wafer includes adhering the carrier plate in direct contact with the dicing tape.

19. The method of claim 13, wherein said pushing includes directly engaging the pushing member with the carrier plate.

20. The method of claim 13, wherein during said pushing, the carrier plate separates the semiconductor wafer from the pushing member.

* * * * *